(12) United States Patent
Uchida et al.

(10) Patent No.: US 7,935,752 B2
(45) Date of Patent: May 3, 2011

(54) THERMOSETTING RESIN COMPOSITION AND USES THEREOF

(75) Inventors: Hiroshi Uchida, Kawasaki (JP); Tomokazu Umezawa, Kawasaki (JP)

(73) Assignee: Showa Denko K.K., Tokyo (JP)

( * ) Notice: Subject to any disclaimer, the term of this patent is extended or adjusted under 35 U.S.C. 154(b) by 414 days.

(21) Appl. No.: 12/281,274

(22) PCT Filed: Mar. 8, 2007

(86) PCT No.: PCT/JP2007/055158
§ 371 (c)(1), (2), (4) Date: Aug. 29, 2008

(87) PCT Pub. No.: WO2007/105781
PCT Pub. Date: Sep. 20, 2007

(65) Prior Publication Data
US 2009/0008138 A1    Jan. 8, 2009

(30) Foreign Application Priority Data

Mar. 9, 2006  (JP) .................................. 2006-064205

(51) Int. Cl.
*C08K 5/5313* (2006.01)
(52) U.S. Cl. ........................................ 524/133; 524/126
(58) Field of Classification Search .................. 524/126, 524/133
See application file for complete search history.

(56) References Cited

U.S. PATENT DOCUMENTS

| | | | |
|---|---|---|---|
| 5,919,844 A | 7/1999 | Shimizu et al. | |
| 6,420,459 B1 | 7/2002 | Hörold | |
| 7,232,876 B2 | 6/2007 | Tamura et al. | |
| 7,446,140 B2 | 11/2008 | Bauer et al. | |

FOREIGN PATENT DOCUMENTS

| | | |
|---|---|---|
| EP | 0 249 723 A2 | 12/1987 |
| EP | 1 088 584 A1 | 4/2001 |
| EP | 1 229 389 A1 | 8/2002 |
| JP | 9235449 A | 9/1997 |
| JP | 09325490 A | 12/1997 |
| JP | 10306201 A | 11/1998 |
| JP | 11242331 A | 9/1999 |
| JP | 11271967 A | 10/1999 |
| JP | 2002284963 A | 10/2002 |
| JP | 2003212954 A | 7/2003 |
| JP | 2004137370 A | 5/2004 |
| JP | 2005290134 A | 10/2005 |
| JP | 2005325358 A | 11/2005 |
| JP | 2006028249 A | 2/2006 |
| WO | 03/005126 A1 | 1/2003 |
| WO | 2005/018298 A2 | 2/2005 |
| WO | 2006/088230 A1 | 8/2006 |
| WO | 2006/106892 A1 | 10/2006 |
| WO | 2007/059152 A1 | 5/2007 |

*Primary Examiner* — Peter Szekely
(74) *Attorney, Agent, or Firm* — Sughrue Mion, PLLC

(57) ABSTRACT

The thermosetting resin composition and the solder resist ink according to the present invention are characterized by comprising: a thermosetting resin (A) comprising (A1) a compound containing an acid anhydride group and/or a carboxyl group and (A2) a compound having a functional group which reacts with (A1) described above and an organic filler (B) containing a phosphorus atom, wherein the organic filler (B) containing a phosphorus atom has an average particle diameter of 50 Êm or less. According to the present invention, capable of being provided at a low cost and a good productivity are an excellent thermosetting resin composition and solder resist ink capable of forming a cured material which achieves an adhesion to a substrate, a low warping property, a flexibility, a plating resistance, a solder heat resistance and a long term reliability as well as a flame retardancy, and a cured material and a protective film which are excellent in the above characteristics. Further, electronic parts having a protective film which is excellent in a flame retardancy and which has a high reliability can be provided.

15 Claims, No Drawings

THERMOSETTING RESIN COMPOSITION AND USES THEREOF

TECHNICAL FIELD

The present invention relates to a thermosetting resin composition comprising a thermosetting resin and an organic filler containing a phosphorus atom as essential components. More specifically, it relates to a thermosetting resin composition which can produce a cured material excellent in a flexibility, a low warping property, a long term reliability and a flame retardancy and which can suitably be used for applications of protective films or electric insulating materials such as solder resists and interlayer insulation films, sealing materials for IC and VLSI, laminated plates and the like, a cured material comprising the above composition and uses thereof.

BACKGROUND ART

A type in which a polyimide film called a cover ray film is punched by means of a die produced fitting to a pattern and then adhered with an adhesive and a type in which an overcoat agent of a UV ray-curing type or a heat-curing type provided with a flexibility or a thermosetting type is coated by a screen printing method have so far been available as a surface protecting film for flexible wiring circuits, and particularly the latter is useful in terms of workability.

Resin compositions comprising mainly epoxy resins, acrylic resins and combined resins thereof are known as the overcoat agents of the above curing type. They comprise resins modified by introducing particularly a butadiene skeleton, a siloxane skeleton, a polycarbonate skeleton, a long-chain aliphatic skeleton and the like as a principal component in many cases. This has enhanced a flexibility and inhibited warping caused by curing shrinkage and heat shrinkage from being brought about while suppressing as much as possible a reduction in a heat resistance, a chemical resistance and an electric insulating property which are essentially imparted to a surface protective film.

In recent years, however, a reduction in a weight and a size of electronic equipments promotes as well a reduction in a thickness of flexible substrates, and influences of a flexibility and curing shrinkage of an overcoated resin composition has come to be exerted more notably. Accordingly, an overcoat agent of a curing type can not satisfy required performances in terms of a flexibility and warpage caused by curing shrinkage. Consequently, various researches are made in order to solve the above problems in the existing situation.

For example, patent document 1 discloses a polyamideimide resin prepared by reacting trimellitic anhydride with both end-diisocyanate polyurethane obtained by reacting a diisocyanate compound with polycarbonatediol compound comprising diol having 6 or less carbon atoms as a raw material. However, a cured matter thereof has the defect that it is inferior in a flame retardancy and is not satisfactory in terms of long term reliability in electric characteristics.

Further, such thermosetting compositions are required to satisfy various physical properties according to uses. In particular, when they are used for electronic parts, a flame retardancy is required as an important physical property in addition to a heat resistance, an insulating property, a flexibility and the like, and if the flame retardancy is low, the uses thereof result in being limited.

However, it has not been easy to endow conventional thermosetting compositions with a sufficiently satisfactory high flame retardancy. Methods using halide base flame retardants such as brominated epoxy resins and flame retardants obtained by combining the above flame retardants with flame retardant auxiliaries such as antimony trioxide have so far been available as a method for providing a flame retardancy (patent document 2, patent document 3 and the like). However, the above flame retardants are inferior in reliability under high temperature environment in a certain case. Further, brominated epoxy resins have involved the problem that blending an amount thereof in which a satisfactory flame retardant effect is obtained damages a flexibility of the resin compositions. In recent years, originating with a dioxin problem, the move of restriction is involved as well in halogenated resins including decabromoether. Non-halogen and non-antimony are requested as well to resin molding materials used for electronic parts. An improvement in a flame retardant effect by blending flame retardants of a conventional type has been limited from the above point of view.

Further, resin compositions using phosphoric esters as a flame retardant are proposed as well (patent document 4, patent document 5, patent document 6 and the like). However, the compositions merely blended with the phosphoric esters has a weak flame retardant effect and can not sufficiently satisfy the standard of a flame retardancy in a UL standard. Accordingly, thermosetting compositions which can achieve non-halogen and non-antimony and which are provided with a higher flame retardancy are desired to be developed.

A phosphorus-containing compound and a resin composition containing the above compound are described in patent document 7, and a phosphorus-containing urethane (meth) acrylate compound having a phosphorus atom in a skeleton and a resin composition containing the above compound are described in patent document 8. It is described as well that the respective compounds exhibit a flame retardant effect. Among them, a cured matter formed from the resin composition described in the patent document 8 has a satisfactory flame retardancy, but it is required to be further improved in an insulation resistant characteristic.

Dialkylphosphinic acid salts are described as flame retardants in patent document 9, patent document 10 and patent document 11, but examples in which resists have successfully been turned into flame retardation are not described therein.

Patent document 1: JP A-2004-137370
Patent document 2: JP A-1997-325490
Patent document 3: JP A-1999-242331
Patent document 4: JP A-1997-235449
Patent document 5: JP A-1998-306201
Patent document 6: JP A-1999-271967
Patent document 7: JP A-2005-290134
Patent document 8: JP A-2003-212954
Patent document 9: JP A-2005-325358
Patent document 10: JP A-2002-284963
Patent document 11: JP A-2006-28249

DISCLOSURE OF THE INVENTION

The present invention intends to solve the foregoing problems in conventional techniques, and an object thereof is to provide a thermosetting resin composition capable of forming a cured material which has a flame retardancy and is excellent in an adhesion to a substrate, a low warping property, a flexibility, a tacking property, a plating resistance, a solder heat resistance and a long term reliability and to provide a solder resist ink or an overcoating ink containing the above thermosetting resin composition.

Further, another object of the present invention is to provide a cured material which is excellent in an adhesion to a substrate, a low warping property, a flexibility, a plating resistance, a solder heat resistance, a long term reliability and a flame retardancy.

Intensive researches repeated by the present inventors have resulted in finding that a thermosetting resin composition comprising a specific organic filler containing a phosphorus atom can solve the problems described above, and they have come to complete the present invention. That is, the present invention relates to the following items.

[1] A thermosetting resin composition comprising: a thermosetting resin (A) comprising (A1) a compound containing an acid anhydride group and/or a carboxyl group and (A2) a compound having a functional group which reacts with (A1) described above and an organic filler (B) containing a phosphorus atom, wherein the organic filler (B) containing a phosphorus atom has an average particle diameter of 50 μm or less.

[2] The thermosetting resin composition as described in the item [1], wherein the organic filler (B) containing a phosphorus atom has an average particle diameter of 20 μm or less.

[3] The thermosetting resin composition as described in the item [1], wherein the organic filler (B) containing a phosphorus atom comprises a phosphinic acid salt represented by the following Formula (1):

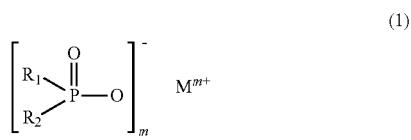

in Formula (1), $R_1$ and $R_2$ each are independently a linear or branched alkyl group having 1 to 6 carbon atoms or an aryl group; M is Mg, Ca, Al, Sb, Sn, Ge, Ti, Fe, Zr, Zn, Ce, Bi, Sr, Mn, Li, Na, K or a protonated nitrogen base; and m is an integer of 1 to 4.

[4] The thermosetting resin composition as described in the item [1], wherein the compound (A1) containing an acid anhydride group and/or a carboxyl group is a carboxyl group-containing polyurethane.

[5] The thermosetting resin composition as described in the item [4], wherein the carboxyl group-containing polyurethane is obtained by reacting:
(a) a polyisocyanate compound,
(b) a carboxyl group-containing dihydroxy compound and
(c) a polyol compound (provided that the compound (b) described above is excluded).

[6] The thermosetting resin composition as described in the item [5], wherein the carboxyl group-containing polyurethane is obtained by reacting (d) a monohydroxy compound and/or (e) a monoisocyanate compound in addition to the compounds (a), (b) and (c) described above.

[7] The thermosetting resin composition as described in the item [1], wherein the compound (A2) having a functional group which reacts with (A1) described above is a compound having an oxirane ring.

[8] The thermosetting resin composition as described in the item [1], further comprising a curing accelerator (C), an organic and/or inorganic additive (D) and, if necessary, an organic solvent (E).

[9] A solder resist ink comprising the thermosetting resin composition as described in any of the items [1] to [8].

[10] A cured material obtained by curing the solder resist ink as described in the item [9].

[11] An insulating protective coating film comprising the cured material as described in the item [10].

[12] A printed-wiring board covered on a part or a whole part with the cured material as described in the item [10].

[13] A flexible printed-wiring board covered on a part or a whole part with the cured material as described in the item [10].

[14] A chip-on film covered on a part or a whole part with the cured material as described in the item [10].

[15] An electronic part comprising the cured material as described in the item [10].

According to the present invention, an excellent thermosetting resin composition capable of forming a cured material which achieves an adhesion to a substrate, a low warping property, a flexibility, a plating resistance, a solder heat resistance and a long term reliability and which achieves as well a conventionally unsatisfactory flame retardancy at the same time, a solder resist and a cured material and a protective film which are excellent in the above characteristics can be provided at low costs and a good productivity. Capable of being provided are electronic parts such as a printed-wiring board, a flexible printed-wiring board and a chip-on film each having a protective film which is excellent in a flame retardancy and which has a high reliability.

BEST MODE FOR CARRYING OUT THE INVENTION

The present invention shall specifically be explained below.

Thermosetting Resin Composition:

The thermosetting resin composition of the present invention comprises a thermosetting resin (A) comprising (A1) a compound containing an acid anhydride group and/or a carboxyl group and (A2) a compound having a functional group which reacts with (A1) described above and an organic filler (B) containing a phosphorus atom as essential components, and it can further comprise, if necessary, a curing accelerator (C), an organic and/or inorganic additive (D) and an organic solvent (E). The components constituting the thermosetting resin composition of the present invention shall be explained below.

(A) Thermosetting Resin:

A resin comprising the compound (A1) containing an acid anhydride group and/or a carboxyl group in combination with the compound (A2) having a functional group which reacts with (A1) described above is used as the thermosetting resin (A) from the viewpoint of a flexibility, an adhesion and an electric insulating property. The preferred compound (A1) includes carboxyl group-containing polyurethane, polyamideimide, block isocyanate group-containing polyurethane and the like. The thermosetting resin (A) according to the present invention is more preferably a resin in which (A1) is carboxyl group-containing polyurethane, and it is particularly preferably a resin in which (A1) is carboxyl group-containing polyurethane and in which (A2) is a compound having an epoxy group.

(A1): Compound Containing an Acid Anhydride Group and/or a Carboxyl Group

<Carboxyl Group-containing Polyurethane>

The carboxyl group-containing polyurethane preferably used in the present invention has two or more carboxyl groups in a molecule and has a urethane bond formed by reacting a polyisocyanate compound with a polyol compound. The above carboxyl group-containing polyurethane can be synthesized, for example, by reacting (a) a polyisocyanate compound, (b) a carboxyl group-containing dihydroxy compound and (c) a polyol compound (provided that the compound of (b) is excluded). In the above reaction, (d) a monohydroxy compound and/or (e) a monoisocyanate compound may be added in addition to the compounds (a), (b) and (c) described above as an end sealing agent.

The polyisocyanate compound (a) includes, for example, diisocyanates such as 2,4-tolylenediisocyanate, 2,6-tolylenediisocyanate, isophoronediisocyanate, 1,6-hexamethylenediisocyanate, 1,3-trimethylenediisocyanate, 1,4-tetramethylenediisocyanate, 2,2,4-trimethylhexamethylenediisocyanate, 2,4,4-trimethylhexamethylenediisocyanate, 1,9-nonamethylenediisocyanate, 1,10-decamethylenediisocyanate, 1,4-cyclohexanediisocyanate, 2,2'-diethyletherdiisocyanate, diphenylmethane-4,4'-diisocyanate, (o, m or p)-xylenediisocyanate, methylenebis(cyclohexylisocyanate), cyclohexane-1,3-dimethylenediisocyanate, cyclohexane-1,4-dimethylenediisocyanate, 1,5-naphthalenediisocyanate, p-phenylenediisocyanate, 3,3'-methyleneditolylene-4,4'-diisocyanate, 4,4'-diphenyletherdiisocyanate, tetrachlorophenylenediisocyanate, norbornanediisocyanate, hydrogenated (1,3- or 1,4-) xylylenediisocyanate and the like. They may be used alone or in combination of two or more kinds thereof.

The carboxyl group-containing dihydroxy compound (b) includes, for example, 2,2-dimethylolpropionic acid, 2,2-dimethylolbutanoic acid, N,N-bishydroxyethylglycine, N,N-bishydroxyethylalanine and the like. They may be used alone or in combination of two or more kinds thereof. Among them, 2,2-dimethylolpropionic acid and 2,2-dimethylolbutanoic acid are preferred from the viewpoint of a solubility in solvents.

Oligomeric diols (provided that the compound (b) described above is excluded) having a low molecular weight to a number average molecular weight of 300 to 50,000 can be used as the polyol compound (c). The number average molecular weight is calculated from a value obtained by measuring a hydroxyl value.

The polyol compound (c) described above includes, for example, diol compounds having 2 to 18 carbon atoms including diols such as ethylene glycol, propylene glycol, 1,3-propanediol, 2-methyl-1,3-propanediol, 1,2-butanediol, 1,3-butanediol, 1,4-butanediol, 1,5-pentanediol, 3-methyl-1,5-pentanediol, 1,6-hexanediol, 2-methyl-1,8-octanediol, 1,8-octanediol, 1,9-nonanediol, tricyclo[5.2.1.0]decanedimethanol, pentacyclopentadecanedimethanol, 1,2-cyclohexanediol, 1,3-cyclohexanediol, 1,4-cyclohexanediol, 1,2-cyclohexanedimethanol, 1,3-cyclohexanedimethanol, 1,4-cyclohexanedimethanol, 1,2-benzenedimethanol, 1,3-benzenedimethanol, 1,4-benzenedimethanol, 2,3-dihydroxynorbornane, 2,5-dihydroxynorbornane, 2,6-dihydroxynorbornane, 2,7-dihydroxynorbornane, dihydroxycyclopentadiene, hydrogenated bisphenol A and the like and diols having an ether group such as diethylene glycol, triethylene glycol, tetraethylene glycol, dipropylene glycol, 2,2-bis[4-(2-hydroxyethyloxy)cyclohexyl]propane, 1,4-bis(2-hydroxyethyloxy)benzene and the like.

Further, oligomeric diol may be used as the polyol compound (c), and the oligomeric diol includes, for example, polycarbonatediols represented by the following Formula (2) which are derived from diols having 4 to 12 carbon atoms, polyetherdiols derived from diols having 2 to 6 carbon atoms, both end-hydroxylated polybutadiene, polyesterdiols derived from dicarboxylic acids having 4 to 18 carbon atoms and diols having 2 to 18 carbon atoms and the like. They may be used alone or in combination of two or more kinds thereof. Among them, polycarbonatediols are preferably used from the viewpoint of the flexibility, the electric characteristics and the heat resistance.

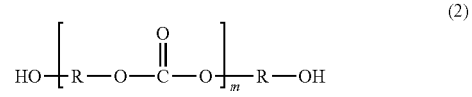

(2)

in Formula (2), R represents an alkylene group having 4 to 12 carbon atoms, and m is a positive integer.

The monohydroxy compound (d) includes, for example, 2-hydroxyethyl(meth)acrylate, hydroxypropyl (meth)acrylate, hydroxybutyl(meth)acrylate, cyclohexanedimethanol mono(meth)acrylate, caprolactone or alkylene oxide adducts of the respective mono(meth)acrylates described above, glycerin di(meth)acrylate, trimethylol di(meth)acrylate, pentaerythritol tri(meth)acrylate, dipentaerythritol penta(meth)acrylate, ditrimethylolpropane tri(meth)acrylate, allyl alcohol, allyloxyethanol, glycolic acid, hydroxypivalic acid, methanol, ethanol, n-propanol, isopropanol, n-butanol, isobutanol, sec-butanol, t-butanol, amyl alcohol, hexyl alcohol, octyl alcohol and the like. They may be used alone or in combination of two or more kinds thereof.

The monoisocyanate compound (e) described above includes, for example, (meth)acryloyloxyethylisocyanate, phenylisocyanate, hexylisocyanate, dodecylisocyanate and the like. They may be used alone or in combination of two or more kinds thereof.

The carboxyl group-containing polyurethane preferably used in the present invention has a number average molecular weight of preferably 500 to 50,000, more preferably 3,000 to 20,000. In this connection, the number average molecular weight is a polystyrene-reduced value measure by gel permeation chromatography (GPC). If a number average molecular weight of the carboxyl group-containing polyurethane is lower than the range described above, an extension degree, a flexibility and a strength of the cured film are damaged in a certain case. On the other hand, if the molecular weight exceeds the range described above, the viscosity is likely to further increase more than necessary.

The carboxyl group-containing polyurethane described above has an acid value of preferably 5 to 150 mg KOH/g, more preferably 30 to 120 mg KOH/g. If the acid value is lower than the range described above, the reactivity with the curable components is reduced to damage the heat resistance in a certain case. On the other hand, if the acid value exceeds the range described above, an alkali resistance of the cured film and the characteristics of the resist such as electric characteristics are lowered in a certain case. An acid value of resins is a value measured based on JIS K5407.

(A2): Compound Having a Functional Group which Reacts with (A1) Described Above

The compound (A1) containing an acid anhydride group and/or a carboxyl group described above is turned into a thermosetting resin by combining with an epoxy compound, an oxetane compound or the like which react with a carboxyl group contained in the resin. The above compound includes, for example, bisphenol A type epoxy resins, bisphenol F type epoxy resins, phenol novolak type epoxy resins, o-cresol novolak type epoxy resins, biphenyl type epoxy resins, multifunctional epoxy resins, amine type epoxy resins, heterocycle-containing epoxy resins, alicyclic epoxy resins, epoxidized polybutadiene, silicon-containing epoxy resins, phosphorus-containing epoxy resins and the like. They may be used alone or in combination of two or more kinds thereof.

The commercial products of the bisphenol A type epoxy resins described above include, for example, "Epicoat 828, 834, 1002 and 1004" manufactured by Japan Epoxy Resins Co., Ltd.

The commercial products of the bisphenol F type epoxy resins described above include, for example, "Epicoat 806, 807 and 4005P" manufactured by Japan Epoxy Resins Co., Ltd. and "YDF-170" manufactured by Tohto Kasei Co., Ltd.

The commercial products of the phenol novolak type epoxy resins described above include, for example, "Epicoat 152 and 154" manufactured by Japan Epoxy Resins Co., Ltd. and "EPPN-201" manufactured by Nippon Kayaku Co., Ltd.

The commercial products of the o-cresol novolak type epoxy resins described above include, for example, "EOCN-125S, 103S and 104S" manufactured by Nippon Kayaku Co., Ltd.

The commercial products of the biphenyl type epoxy resins described above include, for example, "Epicoat YX-4000 and YL-6640" manufactured by Japan Epoxy Resins Co., Ltd.

The commercial products of the multifunctional epoxy resins described above include, for example, "Epicoat 1031S" manufactured by Japan Epoxy Resins Co., Ltd., "Araldite 0163" manufactured by Ciba Specialty Chemicals K.K. and "Denacol EX-611, EX-614, EX-614B, EX-6122, EX-512, EX-521, EX-421, EX-411 and EX-321" manufactured by Nagase Kasei Co., Ltd.

The commercial products of the amine type epoxy resins described above include, for example, "Epicoat 604" manufactured by Japan Epoxy Resins Co., Ltd., "YH-434" manufactured by Tohto Kasei Co., Ltd., "TETRAD-X and TETRAD-C" manufactured by Mitsubishi Gas Chemical Company, Inc., "GAN" manufactured by Nippon Kayaku Co., Ltd. and "ELM-120" manufactured by Sumitomo Chemical Co., Ltd.

The commercial products of the heterocycle-containing epoxy resins described above include, for example, "Araldite PT801" manufactured by Ciba Specialty Chemicals K.K.

The commercial products of the alicyclic epoxy resins described above include, for example, "EHPE3150, EHPE3150CE, Celloxide 2000, Celloxide 2021, Celloxide 2081, EPOLEAD PB3600 and EPOLEAD GT401" manufactured by Daicel Chemical Industries Co., Ltd. and "ERL4234, 4299, 4221 and 4206" manufactured by anion Carbide Corporation.

The commercial products of the epoxidized polybutadiene described above includes, for example, "EPOLEAD PB3600" manufactured by Daicel Chemical Industries Co., Ltd.

The commercial products of the silicon-containing epoxy resins described above include, for example, "KF-105, X-22-163A, X-22-163B, X-22-163C, X-22-169AS and X-22-169B" manufactured by Shin-Etsu Chemical Co., Ltd.

The commercial products of the phosphorus-containing epoxy resins described above include, for example, "FX-305EK70" manufactured by Tohto Kasei Co., Ltd.

The commercial products of the oxetane compound described above include, for example, "Aron Oxetane OXT-101, 121, 211, 212 and 221" manufactured by To a Gosei Co., Ltd.

In the thermosetting resin composition of the present invention, the thermosetting components described above may be used alone or in combination of two or more kinds thereof. A blending amount thereof is preferably an amount in which a ratio of an epoxy equivalent of the thermosetting components to a carboxyl group equivalent of the carboxyl group-containing polyurethane described above is 0.5 to 2.5. If a ratio of the epoxy equivalent is lower than the range described above, a cured film derived from the thermosetting resin composition is unsatisfactory in an electric insulating property, a mechanical strength and a solvent resistance in a certain case because of short curing. On the other hand, if it exceeds the range described above, a proportion of epoxy cross-linking grows large, and the severe conditions are required for completely carrying out curing. In addition thereto, the mechanical strength is lowered, and a shrinkage amount of the cured film is increased, so that the low warping property tends to be deteriorated when it is used as an insulating protective film for a flexible printed-wiring board (FPC).

(B) Organic Filler Containing a Phosphorus Atom

For example, aluminum salts of dialkylphosphinates can be used as the organic filler (B) containing a phosphorus atom used in the present invention. In particular, such organic fillers containing a phosphorus atom have a large phosphorus content and therefore have a large flame retardant efficiency, and they are less liable to be susceptible to hydrolysis. They are hydrophobic and do not reduce the electric characteristics, and therefore use of the above organic fillers containing a phosphorus atom makes it possible to obtain a thermosetting resin composition which is excellent in a flame retardancy and an electric insulating characteristic. In the present invention, the organic filler is a fine powder-shaped organic compound, and it is scarcely soluble or insoluble in organic solvents and water.

The preferred organic filler (B) contains a phosphorus atom comprises a phosphinic acid salt represented by the following Formula (1):

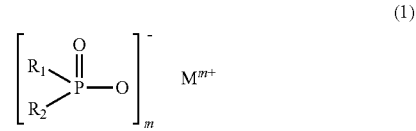

in Formula (1), $R_1$ and $R_2$ each are independently a linear or branched alkyl group having 1 to 6 carbon atoms or an aryl group; M is Mg, Ca, Al, Sb, Sn, Ge, Ti, Fe, Zr, Zn, Ce, Bi, Sr, Mn, Li, Na, K or a protonated nitrogen base; and m is an integer of 1 to 4.

The organic filler (B) containing a phosphorus atom described above includes, for example, ones selected from the group consisting of aluminum trisdiethylphosphinate, aluminum trismethylethylphosphinate, aluminum trisdiphenylphosphinate, zinc bisdiethylphosphinate, zinc bismethylethylphosphinate, zinc bisdiphenylphosphinate, titanyl bisdiethylphosphinate, titanium tetrakisdiethylphosphinate, titanyl bismethylethylphosphinate, titanium tetrakismethylethylphosphinate, titanyl bisdiphenylphosphinate, titanium tetrakisdiphenylphosphinate and the like and optional mixtures thereof. Among them, capable of being given as the suited examples is aluminum trisdiethylphosphinate which is commercially available under the trade names of "Exolit OP-935" and "Exolit OP-930" manufactured by Clariant (Japan) K. K.

The organic filler (B) containing a phosphorus atom described above has an average particle diameter of preferably 50 μm or less, more preferably 20 μm or less. If the average particle diameter is larger than the range described above, the surface area per the fixed amount is reduced, and the dispersion is inferior, so that the satisfactory flame retardancy is not exhibited. Further, it can be the cause of a marked reduction in the performances which have so far been required to the resist, such as a flexibility, an adhesion, a long term reliability and the like. Accordingly, the smaller as much as possible the average particle diameter is, the better. In a method for providing the above particle diameter, the particles may be crushed in advance by means of a bead mill or the like or may be crushed by means of three rolls when blended with the resin.

The organic filler containing a phosphorus atom described above is added in an amount of preferably 25 to 125 mass %, more preferably 50 to 95 mass % per 100 mass % of the thermosetting resin (A) described above. If a blending amount of the organic filler (B) containing a phosphorus atom is too small, the flame retardant effect is unsatisfactory. On the other hand, if the blending amount is too large, the adhesion to the substrate, the low warping property, the flexibility and the long term reliability tend to be lowered.

In the present invention, the average particle diameter means a particle diameter corresponding to 50% of cumulative distribution based on a volume. The average particle diameter can be determined, for example, by a laser diffraction particle size distribution measuring method.

(C) Curing Accelerator

The curing accelerator (C) may be used, if necessary, for the thermosetting resin composition of the present invention in order to accelerate curing reaction. Use of the curing accelerator (C) makes it possible to enhance further more the characteristics such as an adhesion, a chemical resistance, a heat resistance and the like.

The above curing accelerator (C) includes, for example, publicly known curing agents and curing accelerators which have so far been used including imidazole derivatives such as "2MZ", "2E4MZ", "C11Z", "C17Z", "2PZ", "1B2MZ", "2MZ-CN", "2E4MZ-CN", "C11Z-CN", "2PZ-CN", "2PHZ-CN", "2MZ-CNS", "2E4MZ-CNS", "2PZ-CNS", "2MZ-AZINE", "2E4MZ-AZINE", "C11Z-AZINE", "2MA-OK", "2P4 MHZ", "2PHZ" and "2P4BHZ" each manufactured by Shikoku Chemicals Corporation; guanamines such as acetoguanamine, benzoguanamine and the like; polyamines such as diaminodiphenylmethane, m-phenylenediamine, m-xylenediamine, diaminodiphenylsulfone, dicyanediamide, urea, urea derivatives, melamine, polybasic hydrazide and the like; organic acid salts and/or epoxy adducts thereof; amine complexes of boron trifluoride; triazine derivatives such as ethyldiamino-S-triazine, 2,4-diamino-S-triazine, 2,4-diamino-6-xylyl-S-triazine and the like; amines such as trimethylamine, triethanolamine, N,N-dimethyloctylamine, N-benzyldimethylamine, pyridine, N-methylmorpholine, hexa(N-methyl)melamine, 2,4,6-tris(dimethylaminophenol), tetramethylguanidine, m-aminophenol and the like; polyphenols such as polyvinylphenol, bromide of polyvinylphenol, phenol novolak, alkylphenol novolak and the like; organic phosphines such as tributylphosphine, triphenylphosphine, tris-2-cyanoethylphosphine and the like; phosphonium salts such as tri-n-butyl(2,5-dihydroxyphenyl)phosphonium bromide, hexadecyltributylphosphonium chloride and the like; tertiary ammonium salts such as benzyltrimethylammonium chloride, phenyltributylammonium chloride and the like; the polybasic acid anhydrides described above; optical cationic polymerization catalysts such as diphenyliodonium tetrafluoroboroate, triphenylsulfonium hexafluoroantimonate, 2,4,6-triphenylthiopyrylium hexafluorophosphate, "Irgacure 261" manufactured by Ciba-Geigy Co., Ltd., "Optomer SP-170" manufactured by Asahi Denka Co., Ltd. and the like; styrene-maleic anhydride resins; equimolar reaction products of phenylisocyanate with dimethylamine and equimolar reaction products of organic polyisocyanates such as tolylenediisocyanate, isophoronediisocyanate with dimethylamine.

The curing accelerators described above may be used alone or in combination of two or more kinds thereof. The curing accelerator (C) is not indispensably used in the present invention, but particularly when intending to accelerate curing, it can be used in a range of 25 mass % or less per 100 mass % of the thermosetting resin (A) described above. If it exceeds 25 mass %, components sublimating from the cured material are increased, and curing is accelerated more than necessary to notably reduce a pot life of the mixture, so that it is not preferred. The curing accelerator is a polar substance, and therefore in the case of uses in which the insulating characteristic is required, addition thereof exceeding particularly 25 mass. % is not preferred.

(D) Organic and/or Inorganic Additive

Allowed to be blended with the thermosetting resin composition of the present invention are publicly known various additives, for example, organic fillers such as urethane resin fine particles, melamine resin fine particles, acryl resin fine particles, silicone powder and the like; inorganic fillers such as barium sulfate, talc, calcium carbonate, alumina, glass powder, quartz powder, silica and the like; fiber reinforcing materials such as glass fibers, carbon fibers, boron nitride fibers and the like; colorants such as titanium oxide, zinc oxide, carbon black, iron black, organic pigments, organic dyes and the like; antioxidants such as hindered phenol compounds, phosphorus compounds, hindered amine compounds and the like; UV absorbers such as benzotriazole compounds, benzophenone compounds and the like; and ion catchers such as organic and inorganic cation exchangers, anion exchangers, amphoteric exchangers and the like. Further, viscosity controllers, fungicides, antiseptic agents, antioxidants, antistatic agents, plasticizers, lubricants, foaming agents, defoaming agents, thixotropic agents, leveling agents and the like may be blended according to the uses. The viscosity controllers include, for example, silicon powder, barium sulfate and the like. They may be used alone or in combination of two or more kinds thereof. Among then, thixotropic agents and/or deforming agents are preferably used. As a thixotropic agent, an inorganic thixotropic agent is preferably used.

The organic and/or inorganic additive (D) can be preferably used in a range of 5 to 30 mass parts per 100 mass parts of the thermosetting resin (A) (solid matter of the resin).

(E) Organic Solvent

The thermosetting resin composition of the present invention is obtained by dissolving or dispersing the thermosetting resin (A), the organic filler (B) containing a phosphorus atom and, if necessary, the curing accelerator (C) and the organic and/or inorganic additive (D) each described above by means of a mixer such as a disper, a kneader, a three roll mill, a bead mill and the like. In this case, the organic solvent (E) which is inactive to functional groups contained in the composition may be used in order to readily dissolve or disperse the thermosetting resin (A) and the organic filler (B) containing a phosphorus atom or control the viscosity so that it is suited to coating.

The organic solvent (E) can be preferably used in a range of, for example, 40 to 60 mass % per 100 mass % of the whole thermosetting resin composition.

The organic solvent (E) described above includes, for example, toluene, xylene, ethylbenzene, nitrobenzene, cyclohexane, isophorone, diethylene glycol dimethyl ether, ethylene glycol diethyl ether, carbitol acetate, propylene glycol methyl ether acetate, propylene glycol ethyl ether acetate, dipropylene glycol methyl ether acetate, diethylene glycol ethyl ether acetate, methyl methoxypropionate, ethyl methoxypropionate, methyl ethoxypropionate, ethyl ethoxypropionate, ethyl acetate, n-butyl acetate, isoamyl acetate, ethyl lactate, acetone, methyl ethyl ketone, cyclohexanone, N,N-dimethylforamide, N,N-dimethylacetamide, N-methylpyrrolidone, γ-butyrolactone, dimethylsulfoxide, chloroform, methylene chloride and the like. They may be used alone or in combination of two or more kinds thereof.

The thermosetting resin composition of the present invention is particularly useful as a solder resist ink and an overcoating ink since the cured material thereof is excellent in a flexibility, an adhesion, a heat resistance and the like. The cured material of the thermosetting resin composition of the present invention can suitably be used in the fields of electric insulating materials such as solder resists and interlayer insulation films, sealing materials for IC and VLSI, laminated plates, electronic parts and the like.

Solder Resist Ink:

The solder resist ink of the present invention contains the thermosetting resin composition of the present invention described above. The solder resist ink of the present invention may contain a colorant, and the colorant includes phthalocyanine blue, phthalocyanine green, iodine green, disazo yellow, crystal violet, titanium oxide, carbon black, naphthalene black and the like.

The solder resist ink of the present invention has a viscosity falling in a range of usually 50 to 5000 dPa·s, preferably 250 to 2000 dPa·s which is measured at 25° C. by means of a rotation viscometer.

The solder resist ink of the present invention is coated on a printed-wiring board, a flexible printed-wiring board, a chip-on film (COF) or the like in a suitable thickness, dried by subjecting to heat treatment and then cured by hot curing, whereby it can be turned into a cured material. For example, a screen printing method, a curtain coating method, a spray coating method, a roll coating method and the like can be used as a coating method therefor, and the screen printing method is suited when forming patterns. Further, a suitable value of the coated thickness is varied according to a wiring thickness of a printed-wiring board, and it is usually 5 to 40 μm and suitably 5 to 20 μm in the case of uses in which fine patterns are required, such as a chip-on film (COF). A printed-wiring board, a flexible printed-wiring board and a chip-on film (COF) having thereon the cured material of the present invention are suited as electronic parts.

The solder resist ink of the present invention is excellent in an adhesion to a substrate, an insulating property, a heat resistance, a warping deformation property and a flexibility when cured and turned into a thin film, and it is excellent particularly in a flame retardancy.

EXAMPLES

The present invention shall more specifically be explained below with reference to examples, but the present invention shall not be restricted to these examples.

Synthetic Example 1

A reactor equipped with a stirring device, a thermometer and a condenser was charged with 167.8 g of "C-1065N" (polycarbonatediol, raw material diol mole ratio: 1,9-nonanediol:2-methyl-1,8-octanediol=65:35, molecular weight: 991) manufactured by Kuraray Co., Ltd. as a polyol compound, 31.7 g of 2,2-dimethylolbutanoic acid (manufactured by Nippon Kasei Chemical Co., Ltd.) as a carboxyl group-containing dihydroxy compound and 300.3 g of diethylene glycol ethyl ether acetate (manufactured by Daicel Chemical Industries, Ltd.) as a solvent, and the reactor was heated at 90° C. to dissolve all the raw materials. Then the temperature of the reaction liquid was lowered down to 70° C., and 10.5 g of methylenebis(4-cyclohexylisocyanate) ("Desmodur W" manufactured by Sumika Bayer Urethane Co., Ltd.) as polyisocyanate was dropwise added in 30 minutes by means of a dropping funnel. After finishing dropwise adding, the reaction was carried out at 80° C. for one hour, 90° C. for one hour and 100° C. for 2 hours, and after confirming that isocyanate was almost exhausted, 2.92 g of isobutanol (manufactured by Wako Pure Chemical Industries, Ltd.) was dropwise added to further carry out the reaction at 105° C. for 1.5 hour. The carboxyl group-containing polyurethane thus obtained had a number average molecular weight of 6,800 and an acid value of 39.9 mg KOH/g in a solid matter.

Synthetic Example 2

A reactor equipped with a stirring device, a thermometer and a condenser was charged with 664.46 g of "G-1000" (1,2-polybutadienediol) manufactured by Nippon Soda Co., Ltd. as a polyol compound, 105.64 g of 2,2-dimethylolbutanoic acid (manufactured by Nippon Kasei Chemical Co., Ltd.) as a carboxyl group-containing dihydroxy compound and 1000.00 g of diethylene glycol ethyl ether acetate (manufactured by Daicel Chemical Industries, Ltd.) as a solvent, and the reactor was heated at 80° C. to dissolve all the raw materials. "Takenate 600" (1,3-bis(isocyanatemethyl)cyclohexane) 227.90 g as polyisocyanate manufactured by Mitsui Takeda Chemical Co., Ltd. was dropwise added in 30 minutes by means of a dropping funnel. After finishing dropwise adding, the reaction was carried out at 80° C. for one hour, 90° C. for one hour and 100° C. for 3 hours, and after confirming that isocyanate was almost exhausted, 2.92 g of isobutanol (manufactured by Wako Pure Chemical Industries, Ltd.) was dropwise added to further carry out the reaction at 105° C. for 1.5 hour. The carboxyl group-containing polyurethane thus obtained had a number average molecular weight of 8,800 and an acid value of 40.7 mg KOH/g in a solid matter.

Synthetic Example 3

A reactor equipped with a stirring device, a thermometer and a condenser was charged with 230.7 g of "T-4691" (copolymerized polycarbonatediol of 1,4-butanediol with 1,6-hexanediol in a mole ratio of 90 : 10) manufactured by Asahi Chemical Industry Co., Ltd., 37.0 g of 2,2-dimethylolbutanoic acid (manufactured by Nippon Kasei Chemical Co., Ltd.) as a carboxyl group-containing dihydroxyl compound and 346.9 g of diethylene glycol ethyl ether acetate (manufactured by Daicel Chemical Industries, Ltd.) as a solvent, and the reactor was heated at 70° C. to dissolve all the raw materials to obtain a solution. "T-80" (a mixture of 80:20 of 2,4-tolylenediisocyanate and 2,6-tolylenediisocyanate) 82.8 g as polyisocyanate manufactured by Mitsui Takeda Chemical Co., Ltd. was dropwise added to the above solution in 10 minutes by means of a dropping funnel. After finishing dropwise adding, the reaction was carried out at 70° C. for one hour, 80° C. for one hour, 90° C. for one hour and 100° C. for one hour, and after confirming that isocyanate was almost exhausted, 3 g of isobutanol (manufactured by Wako Pure Chemical Industries, Ltd.) was dropwise added to further carry out the reaction at 100° C. for one hour. The carboxyl group-containing polyurethane thus obtained had a number average molecular weight of 4,500 and an acid value of 40.0 mg KOH/g in a solid matter.

Synthetic Example 4

A reactor equipped with a stirring device, a thermometer and a condenser was charged with 62.5 g of "Kuraray Polyol P-2030" (copolymerized polyesterpolyol of isophthalic acid with 3-methyl-1,5-pentanediol) manufactured by Kuraray Co., Ltd., 10.4 g of 2,2-dimethylolbutanoic acid (manufactured by Nippon Kasei Chemical Co., Ltd.) as a carboxyl group-containing dihydroxyl compound and 101.5 g of diethylene glycol ethyl ether acetate (manufactured by Daicel Chemical Industries, Ltd.) as a solvent, and the reactor was heated at 90° C. to dissolve all the raw materials. Then, 26.8 g of methylenebis(4-cyclohexylisocyanate) ("Desmodur W" manufactured by Sumika Bayer Urethane Co., Ltd.) as polyisocyanate was dropwise added in 30 minutes by means of a dropping funnel. After finishing dropwise adding, the reaction was carried out at 80° C. for one hour, 90° C. for one hour and 100° C. for 1.5 hour, and after confirming that isocyanate was almost exhausted, 1.5 g of isobutanol (manufactured by Wako Pure Chemical Industries, Ltd.) was dropwise added to further carry out the reaction at 100° C. for 30 minutes. The carboxyl group-containing polyurethane thus obtained had a number average molecular weight of 9,400 and an acid value of 40.3 mg KOH/g in a solid matter.

Synthetic Example 5

A reactor equipped with a stirring device, a thermometer and a condenser was charged with 560.30 g of "UC-CARB100" (polycarbonatediol using cyclohexanedimethanol for raw material diol) manufactured by Ube Industries, Ltd., 1105.64 g of 2,2-dimethylolbutanoic acid (manufactured by Nippon Kasei Chemical Co., Ltd.) as a carboxyl group-containing dihydroxyl compound and 1,000 g of diethylene glycol ethyl ether acetate (manufactured by Daicel Chemical Industries, Ltd.) as a solvent, and the reactor was heated at 90° C. to dissolve all the raw materials. Methylenebis(4-cyclohexylisocyanate) ("Desmodur W" manufactured by Sumika Bayer Urethane Co., Ltd.) 334.05 g as polyisocyanate was dropwise added in 30 minutes by means of a dropping funnel. After finishing dropwise adding, the reaction was carried out at 80° C. for one hour, 90° C. for one hour and 100° C. for 1.5 hour, and after confirming that isocyanate was almost exhausted, 2.5 g of isobutanol (manufactured by Wako Pure Chemical Industries, Ltd.) was dropwise added to further carry out the reaction at 100° C. for 30 minutes. The carboxyl group-containing polyurethane thus obtained had a number average molecular weight of 11,400 and an acid value of 68.3 mg KOH/g in a solid matter.

Example 1

The polyurethane solution (solid matter concentration: 45 mass %) obtained in Synthetic Example 1 was blended with 18 mass % of an epoxy resin ("NC-7000-L" manufactured by Tohto Kasei Co., Ltd.) having an epoxy group of 1.1 equivalent per equivalent of a carboxyl group of the above polyurethane, 1 mass % of melamine as a curing accelerator, 10 mass % of "R-974" manufactured by Nippon Aerosil Co., Ltd. as a thixotropic agent, 0.75 mass % of "Floren AO-40H" manufactured by Kyoeisha Chemical Co., Ltd. as a defoaming agent and 76.4 mass % of "Exolit OP-935" (average particle diameter: 2 to 3 μm) manufactured by Clariant (Japan) K. K. as an organic filler containing a phosphorus atom each based on 100 mass % of the solid matter of the above polyurethane. Then, the composition obtained by blending the above components was kneaded by allowing it to pass three times through a three roll mill (model: RIII-1RM-2, manufactured by Kodaira Seisakusho Co., Ltd.), whereby a solder resist ink was prepared.

Example 2

A solder resist ink was obtained in the same manner as in Example 1, except that the epoxy resin was changed to 21.8 mass % of "NC-3000" manufactured by Tohto Kasei Co., Ltd. based on 100 mass % of the solid matter of the polyurethane.

Example 3

A solder resist ink was obtained in the same manner as in Example 1, except that the epoxy resin was changed to 19.8 mass % of "Epicoat 834" manufactured by Japan Epoxy Resins Co., Ltd. based on 100 mass % of the solid matter of the polyurethane.

Example 4

The polyurethane solution (solid matter concentration: 50 mass %) obtained in Synthetic Example 2 was blended with 19.8 mass % of an epoxy resin ("Epicoat 834" manufactured by Japan Epoxy Resins Co., Ltd.) having an epoxy group of 1.1 equivalent per equivalent of a carboxyl group of the above polyurethane, 1 mass % of "2P4 MHZ-PW" manufactured by Shikoku Chemicals Corporation as a curing accelerator, 10 mass % of "R-974" manufactured by Nippon Aerosil Co., Ltd. as a thixotropic agent, 0.75 mass % of "Floren AO-40H" manufactured by Kyoeisha Chemical Co., Ltd. as a defoaming agent and 76.4 mass % of "Exolit OP-935" (average particle diameter: 2 to 3 μm) manufactured by Clariant (Japan) K. K. as an organic filler containing a phosphorus atom each based on 100 mass % of the solid matter of the above polyurethane. Then, the composition obtained by blending the above components was kneaded by allowing it to pass three times through a three roll mill (model: RIII-1RM-2, manufactured by Kodaira Seisakusho Co., Ltd.), whereby a solder resist ink was prepared.

Example 5

A solder resist ink was obtained in the same manner as in Example 4, except that the polyurethane solution obtained in Synthetic Example 3 was used.

Example 6

A solder resist ink was obtained in the same manner as in Example 4, except that the polyurethane solution obtained in Synthetic Example 4 was used.

Example 7

A solder resist ink was obtained in the same manner as in Example 4, except that the polyurethane solution obtained in Synthetic Example 5 was used.

Comparative Example 1

A solder resist ink was obtained in the same manner as in Example 3, except that the organic filler containing a phosphorus atom was not used.

Comparative Example 2

A solder resist ink was obtained in the same manner as in Example 4, except that the organic filler containing a phosphorus atom was not used.

Evaluation:

The solder resist inks obtained in Examples 1 to 7 and Comparative Examples 1- and 2 were used to carry out evaluations. The evaluation results are shown in Table 1.

<Combustibility>

The solder resist ink obtained was applied on a polyimide film having a thickness of 38 μm [Kapton (registered trade name) 150EN, manufactured by Du Pont-Toray Co., Ltd.] and a polyimide film having a thickness of 75 μm [Kapton (registered trade name) 300H, manufactured by Du Pont-Toray Co., Ltd.] by screen printing by means of a #250 mesh polyester plate. The film after printing was dried at 80° C. for 30 minutes and then thermally cured at 120° C. for 30 minutes. After thermally curing, the ink was applied as well on the other surface by screen printing. It was dried at 80° C. for 30 minutes and then cured at 120° C. for one hour and 150° C. for 2 hours. The cured film thus obtained was subjected to a test by a vertical combustion method based on a UL 94 standard. The film thickness after cured was about 12 μm.

<Long Term Reliability>

The solder resist ink was applied on IPC-C (comb pattern) of a commercial substrate (IPC standard) by screen printing by means of a #250 mesh polyester plate, and it was dried at 80° C. for 30 minutes and then thermally cured at 120° C. for one hour and 150° C. for 2 hours. The film thickness after cured was about 12 μm. A bias voltage of 100 V was applied on the substrate under the environment of 120° C. and a relative humidity of 95%, and the substrate was left standing for 200 hours to evaluate an electric insulating property on the following criteria.

◎: no reduction in both of migration and an insulation resistance value

○: reduction observed in migration or an insulation resistance value after 100 to 200 hours Δ: reduction observed in migration or an insulation resistance value after 50 to 100 hours X: reduction observed in migration or an insulation resistance value after 50 hours or shorter <Warping Property>

The solder resist ink obtained was applied on a polyimide film having a thickness of 38 μm [Kapton (registered trade name) 150EN, manufactured by Du Pont-Toray Co., Ltd.] by screen printing by means of a #250 mesh polyester plate. The film was dried at 80° C. for 30 minutes and then heated at 120° C. for 60 minutes and 150° C. for 2 hours. The coated film obtained was cut out in the form of a circle having a diameter of 5 cm and put on a plate with the coated surface turned upward to evaluate a warping height. The film thickness after cured was about 12 μm.

○: warping height: 2 to less than 4 mm
Δ: warping height: 4 to less than 6 mm
X: warping height: 6 mm or more <Flexibility>

The solder resist ink obtained was applied on a polyimide film having a thickness of 38 μm [Kapton (registered trade name) 150EN, manufactured by Du Pont-Toray Co., Ltd.] by screen printing by means of a #250 mesh polyester plate. The film was dried at 80° C. for 30 minutes and then heated at 120° C. for 60 minutes and 150° C. for 2 hours. The polyimide film on which the solder resist ink was applied and thermally cured was folded by 180° with the coated surface turned to an outside, and whitening of the cured film was observed to evaluate the flexibility on the following criteria. The film thickness after cured was about 12 μm.

○: no whitening of the cured film
X: the cured film was whitened or cracked

TABLE 1

| | Organic filler | Flame retardancy 150EN | Flame retardancy 300H | Long term reliability | Warping property | Flexibility |
|---|---|---|---|---|---|---|
| Example 1 | present | VTM-0 | V-0 | ◎ | Δ | ○ |
| Example 2 | present | VTM-0 | V-0 | ◎ | Δ | ○ |
| Example 3 | present | VTM-0 | V-0 | ○ | ○ | ○ |
| Example 4 | present | VTM-0 | V-0 | Δ | ○ | ○ |
| Example 5 | present | VTM-0 | V-0 | ○ | ○ | ○ |
| Example 6 | present | VTM-0 | V-0 | ○ | Δ | ○ |
| Example 7 | present | VTM-0 | V-0 | ○ | Δ | ○ |
| Comparative Example 1 | none | X | X | ◎ | ○ | ○ |
| Comparative Example 2 | none | X | X | ○ | ○ | ○ |

The inks marked with Δ or higher were judged to be usable.

INDUSTRIAL APPLICABILITY

The thermosetting resin composition of the present invention can form a cured material which is excellent in an adhesion to a substrate, a low warping property, a flexibility, a plating resistance, a solder heat resistance, a long term reliability and a flame retardancy, and therefore it is useful as a solder resist ink, an overcoating agent and the like and can suitably be applied to the fields of electric insulating materials such as solder resists and interlayer insulation films, sealing materials for IC and VLSI, laminated plates, electronic parts and the like.

The thermosetting resin composition of the present invention and the cured material of the solder resist ink can be utilized as an insulating protective coating film and can be used for covering a part or a whole part in a printed-wiring board, a flexible printed-wiring board, a chip-on film (COF) and the like.

The invention claimed is:

1. A thermosetting resin composition comprising:
   a thermosetting resin (A) comprising (A1) a compound containing an acid anhydride group and/or a carboxyl group and (A2) a compound having a functional group which reacts with (A1) described above and
   an organic filler (B) containing a phosphorus atom,
   wherein the organic filler (B) containing a phosphorus atom has an average particle diameter of 50 μm or less.

2. The thermosetting resin composition as described in claim 1, wherein the organic filler (B) containing a phosphorus atom has an average particle diameter of 20 μm or less.

3. The thermosetting resin composition as described in claim 1, wherein the organic filler (B) containing a phosphorus atom comprises a phosphinic acid salt represented by the following Formula (1):

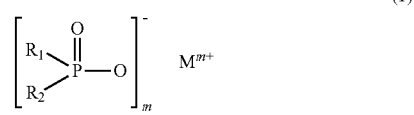

(1)

or branched alkyl group having 1 to 6 carbon atoms or an aryl group; M is Mg, Ca, Al, Sb, Sn, Ge, Ti, Fe, Zr, Zn, Ce, Bi, Sr, Mn, Li, Na, K or a protonated nitrogen base; and m is an integer of 1 to 4.

4. The thermosetting resin composition as described in claim 1, wherein the compound (A1) containing an acid anhydride group and/or a carboxyl group is a carboxyl group-containing polyurethane.

5. The thermosetting resin composition as described in claim 4, wherein the carboxyl group-containing polyurethane is obtained by reacting:
(a) a polyisocyanate compound,
(b) a carboxyl group-containing dihydroxy compound and
(c) a polyol compound (provided that the compound (b) described above is excluded).

6. The thermosetting resin composition as described in claim 5, wherein the carboxyl group-containing polyurethane is obtained by reacting (d) a monohydroxy compound and/or (e) a monoisocyanate compound in addition to the compounds (a), (b) and (c) described above.

7. The thermosetting resin composition as described in claim 1, wherein the compound (A2) having a functional group which reacts with (A1) described above is a compound having an oxirane ring.

8. The thermosetting resin composition as described in claim 1, further comprising a curing accelerator (C), an organic and/or inorganic additive (D) and, if necessary, an organic solvent (E).

9. A solder resist ink comprising the thermosetting resin composition as described in claim 1.

10. A cured material obtained by curing the solder resist ink as described in claim 9.

11. An insulating protective coating film comprising the cured material as described in claim 10.

12. A printed-wiring board covered on a part or a whole part with the cured material as described in claim 10.

13. A flexible printed-wiring board covered on a part or a whole part with the cured material as described in claim 10.

14. A chip-on film covered on a part or a whole part with the cured material as described in claim 10.

15. An electronic part comprising the cured material as described in claim 10.

* * * * *